United States Patent
Chen

(10) Patent No.: US 6,836,438 B2
(45) Date of Patent: Dec. 28, 2004

(54) METHOD AND APPARATUS FOR DYNAMICALLY HIDING A DEFECT IN AN EMBEDDED MEMORY

(75) Inventor: Aphrodite Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 85 days.

(21) Appl. No.: 10/212,079

(22) Filed: Aug. 6, 2002

(65) Prior Publication Data

US 2003/0133336 A1 Jul. 17, 2003

(30) Foreign Application Priority Data

Jan. 11, 2002 (TW) ........................................ 91100438 A

(51) Int. Cl.$^7$ ................................................. G11C 7/00
(52) U.S. Cl. ...................................... 365/200; 365/201
(58) Field of Search ................................ 365/200, 201; 714/6

(56) References Cited

U.S. PATENT DOCUMENTS

| | | | | |
|---|---|---|---|---|
| 4,051,460 A | * | 9/1977 | Yamada et al. | 711/115 |
| 4,639,915 A | * | 1/1987 | Bosse | 714/711 |
| 6,198,675 B1 | * | 3/2001 | Hellriegel et al. | 365/200 |
| 6,327,680 B1 | * | 12/2001 | Gervais et al. | 714/711 |

* cited by examiner

*Primary Examiner*—Anh Phung
(74) *Attorney, Agent, or Firm*—Rabin & Berdo, P.C.

(57) ABSTRACT

A method and apparatus are provided for dynamically hiding a defect in a memory. In one embodiment, an entry occupied mapping includes a plurality of fields each corresponding to and entry of a memory, and during the initial test procedure of the memory the field corresponding to a defective entry is marked to make it perceived as occupied and thus the defective entry will not be used hereafter. In another embodiment, pseudo entries are selected from a backup register pool or backup memory. Each pseudo entry corresponds to a defective entry, and subsequent access to the defective entry is redirected to the corresponded pseudo entry.

5 Claims, 5 Drawing Sheets

METHOD AND APPARATUS FOR DYNAMICALLY HIDING A DEFECT IN AN EMBEDDED MEMORY

FIELD OF THE INVENTION

The present invention relates generally to a memory and, more specifically, to a method and apparatus for dynamically hiding a defect in a memory. The invented method and apparatus is particularly useful and suitable for a chip with an embedded memory.

BACKGROUND OF THE INVENTION

Memory defects can result in malfunction of a system utilizing the defective memory and cause an abrupt shutdown without warning in advance, which not only takes the user considerable time, but also may cause unrecoverable loss. Unfortunately, there is a inevitably certain percentage of memory with memory defects. Usually a test is performed immediately after the manufacture of the chip, so that defective memory can be found and disposed of. However, disposing of defective memory leads to economic loss, and it is especially regrettable to discard a chip because of minor defects. The capacity of memory is increasing and the process technology is advancing continuously. For a chip with minor defects in memory to be usable instead of having to be discarded, a redundancy scheme is proposed to replace or repair the defective memory. Typically a redundancy scheme includes four procedures, i.e., testing, analyzing, repairing and retesting. A series of test signal patterns are applied to the memory to detect the position of a memory failure during the first procedure, and an analysis procedure follows to decide the optimum usage of the redundant memory. Then fuses are blown to define the connections and disconnections of the circuit in the repair procedure, and finally the repaired chip is retested to confirm that it functions correctly.

Even though repairing memory by using a redundancy scheme can reduce memory waste, the additional circuitry and fuses consume considerable chip area and complicate the circuit as well as the process. This not only increases the cost but also enlarges the chip. Furthermore, such repairing requires a lot of time on testing and analyzing, which further increases the time and cost. The problem due to memory defects is more severe for a chip with embedded memory because its circuitry is much more complicated than that of a stand-alone memory chip. A chip with embedded memory has a lot of circuitry around the memory, and it is thus more difficult to test the memory, and the tester is also more expensive and the test procedure is longer. Some schemes have been proposed to improve the situation. For example, U.S. Pat. No. 5,841,784 to Chan et al. discloses a method and circuit employing a switching circuit to temporarily couple an embedded memory in an integrated circuit to an interconnect pad during a memory test mode period to reduce test time and cost. U.S. Pat. No. 6,067,262 to Irrinki et al. provides a redundancy analysis methodology with built-in-self-test and built-in-self-repair so that an embedded memory can be tested on a standard logic tester and a detected field error can be related to its operation conditions. U.S. Pat. No. 6,073,258 to Wheater teaches a method and apparatus for executing two-dimensional redundancy computation to avoid collecting failure data during a test and repair procedure.

As the demand for larger embedded memory grows, the yield limitation imposed by the manufacturing process is also enlarged. Although a redundancy test is typically used as a functional test, this method often proves itself not enough or not applicable for larger embedded memory. Since it is more difficult to design and manufacture embedded memory, the loss caused by disposing of the chip due to memory defects therewith is larger, and it is thus desirable to decrease the number of chips with embedded memory that need to be discarded. U.S. Pat. No. 5,471,431 to McClure proposes a method and structure to define a functional part from an embedded memory by blowing fuses, which minimizes chip disposal though a smaller functional memory is obtained.

However, the above-mentioned prior art schemes can only filter out the defects found upon testing and fixed by repair, and any defects discovered or developed thereafter cannot be remedied and eventually the chip with memory defects in such manner must still be discarded. More seriously is that defects occurring in a memory after the test procedure will cause the chip to malfunction or a system to crash, thereby resulting in even larger loss. U.S. Pat. No. 5,764,878 to Kablanian suggests a built-in-self-repair system on a chip with embedded memory, which automatically executes the procedures of testing, repairing and retesting each time the computer system is powered up, and this method can therefore dynamically repair memory defects even it introduces large and complex circuitry into the chip and each power up of the computer system must go through those complicated and lengthy procedures. Moreover, the address table of the memory must be configured each time for the Kablanian scheme. These inconveniences render this technique impractical and the system will crash once there are too many defects, exceeding what the redundant circuit can repair. U.S. Pat. No. 6,192,486 issued to Correale, Jr. et al. provides a memory defect steering circuit that does not carry out fuse-blowing repair, but detects and bypasses a defective memory each time the computer system boots up, and then recalculates the size of the functional memory, and modifies the memory addresses. While this method decreases the memory size, it can dynamically exclude memory defects. However, it is inconvenient to recalculate the effective memory size and modify the memory addresses, and the extra circuitry to modify the memory address occupies considerable chip area. Furthermore, due to the fact that its memory address space is continuous, remapping the memory address cannot exclude a single memory defect, but instead starts from the next available entry following the defective entry, and thus the entries before the defective memory are wasted.

SUMMARY OF THE INVENTION

The present invention is proposed to overcome the above-mentioned problems by masking memory defects, instead of repairing the defective memory by blowing fuses, and thus to avoid the lengthy procedures of testing, repairing and retesting. The invented scheme may also result in a reduction of memory volume, and makes it possible to use defective chips and not to dispose of them.

One feature of the present invention is to employ a simple and straightforward method and apparatus to exclude memory defects.

One feature of the present invention is to reduce the need for chip disposing due to memory defects therewith.

One feature of the present invention is to dynamically exclude memory defects by discovering and hiding the memory defects each time the chip with the memory defects is powered up.

One feature of the present invention is to avoid large and redundant circuitry introduced into the memory chip for excluding memory defects therewith.

One feature of the present invention is to avoid recalculating memory size and addresses resulting from the memory defects.

One feature of the present invention is to preserve the functional circuit on a chip with embedded memory.

One feature of the present invention is to avoid the necessity to repair memory.

In one embodiment of the present invention, an initial test is conducted on a memory to discover defective entries, an entry occupied mapping is prepared that contains a plurality of fields where each filed corresponds to an entry of the memory, and an initialization control apparatus is used to mark the fields corresponding to defective entries to make them be perceived as occupied so that the defective entries will not be accessed until the system is shut down.

In another embodiment of the present invention, a backup memory or backup register pool is provided and an error entry recorder/controller is used to record error entries and pick up a pseudo entry from the backup memory or backup register pool for corresponding to each respective error entry after the memory goes through an initial test. A subsequent access to an error entry results in a redirect to the corresponding pseudo entry.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

A method and apparatus are disclosed to handle defects in a memory, especially in a memory embedded in a chip, from a different point of view, by which the memory defects are hidden so that it looks as it used to be, instead of repairing the memory by fuses or dealing with the memory size, and thereby the user does not know that the memory is defective. The method detects the locations of defective entries by the test procedure already scheduled during a system boot-up, without introducing an additional test procedure as well as repair and retest procedures, and thus it is not necessary to spend lengthy processing time. Furthermore, only simple apparatus is used for marking or recording memory defects, so there is thus no need to include a complex processing circuit. Though it results in memory size reduction in this manner, the invented method and apparatus also make a chip with a defective memory usable instead of needing to be discarded. The invented technique dynamically excludes the defective entries in the memory so as to avoid system malfunction or crash.

Figure 1:
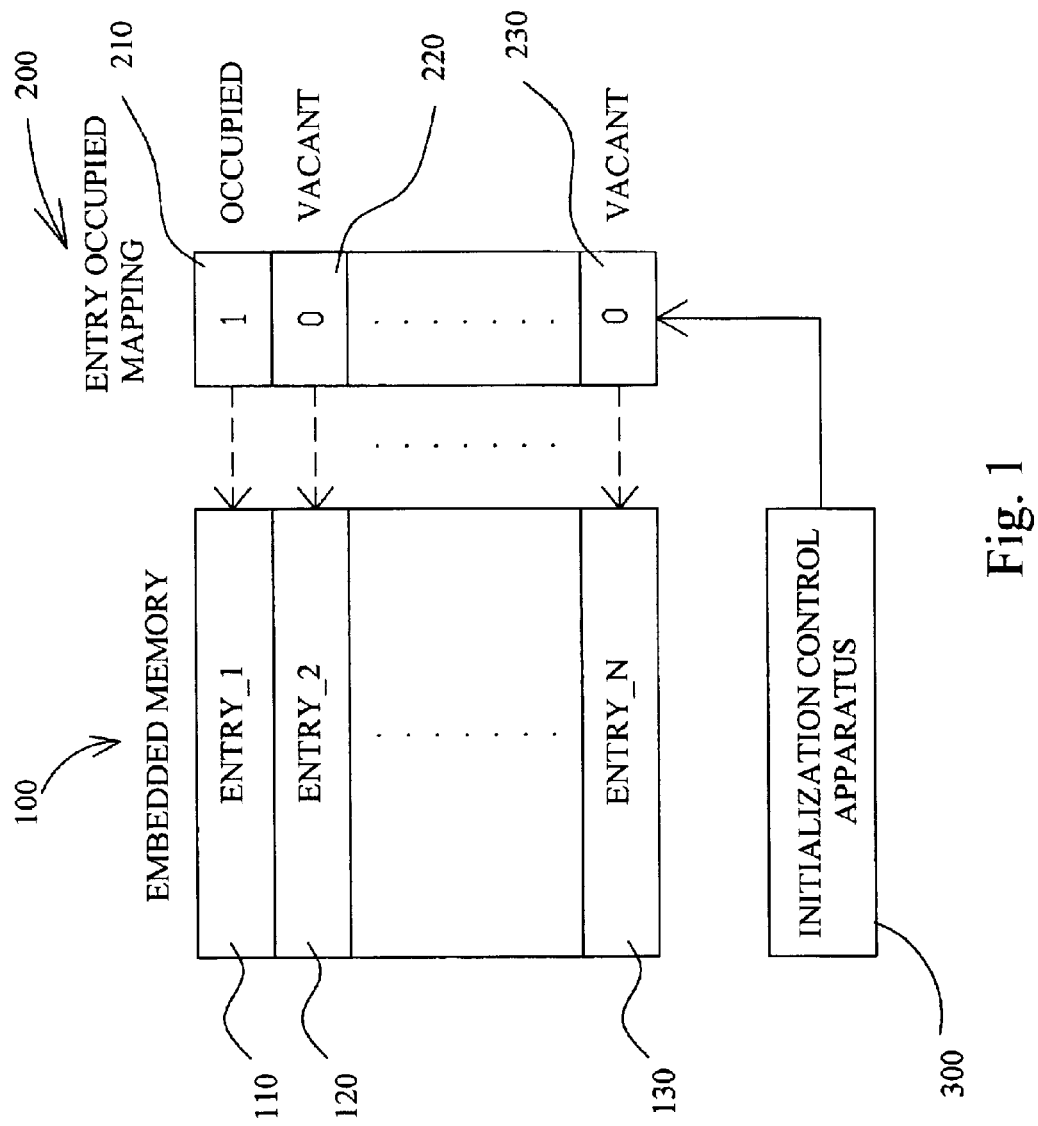
FIG. 1 shows the first embodiment apparatus according to the present invention.

FIG. 1 shows a schematic diagram of the first embodiment according to the present invention, where an embedded memory 100 has N entries, numbered from 1, 2, ..., N, and as is known, an entry occupied mapping 200 is used to indicate whether the embedded memory 100 is vacant or occupied. The number of the fields in the entry occupied mapping 200 is the same as the size of the embedded memory 100, namely N, and each field of the entry occupied mapping 200 corresponds to an entry. For instance the first field 210 corresponds to entry 110, the second field 220 corresponds to entry 120, and the Nth field 230 corresponds to the last entry 130. The content of the field represents whether its corresponding entry is vacant or occupied, as shown in this figure. In this example, the content of the first field 210 is "1", representing that its corresponded entry 100 is already occupied, while the contents of the second field 220 and the last field 230 are both "0", representing that their respective corresponded entries 120 and 130 are vacant. To avoid possible confusion, the test circuit on the chip with the embedded memory 100 is not shown in this figure. As in a general computer system, upon start up the system automatically tests the embedded memory 100 during the initialization procedure and the locations of defective entries can be discovered. This embodiment circuit has an initialization control apparatus 300 that only includes simple control logic and can be implemented in hardware or software, either built in the chip with the embedded memory 100 or external to the chip. During the initialization procedure, the initialization control apparatus 300 marks the fields of the entry occupied mapping 200 that correspond to the defective entries, as shown in this figure. In this example the first entry 110 of the embedded memory 100 fails in the test, and thus the initialization control apparatus 300 writes a "1" into its corresponding field 210 of the entry occupied mapping 200 to indicate that the entry 110 has been occupied, so that the first entry 110 of the embedded memory 100 will no longer be accessed during the subsequent operations. That is, the entry 110 is hidden right after the initialization. Occupation indication is written to appropriate fields of the entry occupied mapping 200 by the initialization control apparatus 300 during the initialization procedure as mentioned above, and thus the defective entries are hidden. This method is simple and fast, and does not need to be verified again. Neither does it need a complicated circuit or processing. Though hiding the defective entries reduces the effective size of the embedded memory 100, it makes a chip with defects usable instead of needing to be disposed of. Further, this scheme dynamically excludes the defective entries based on the updated information upon each start up of the system and prevents the system from malfunctioning or crashing due to any defective entries that develop after the chip is used.

Figure 2:
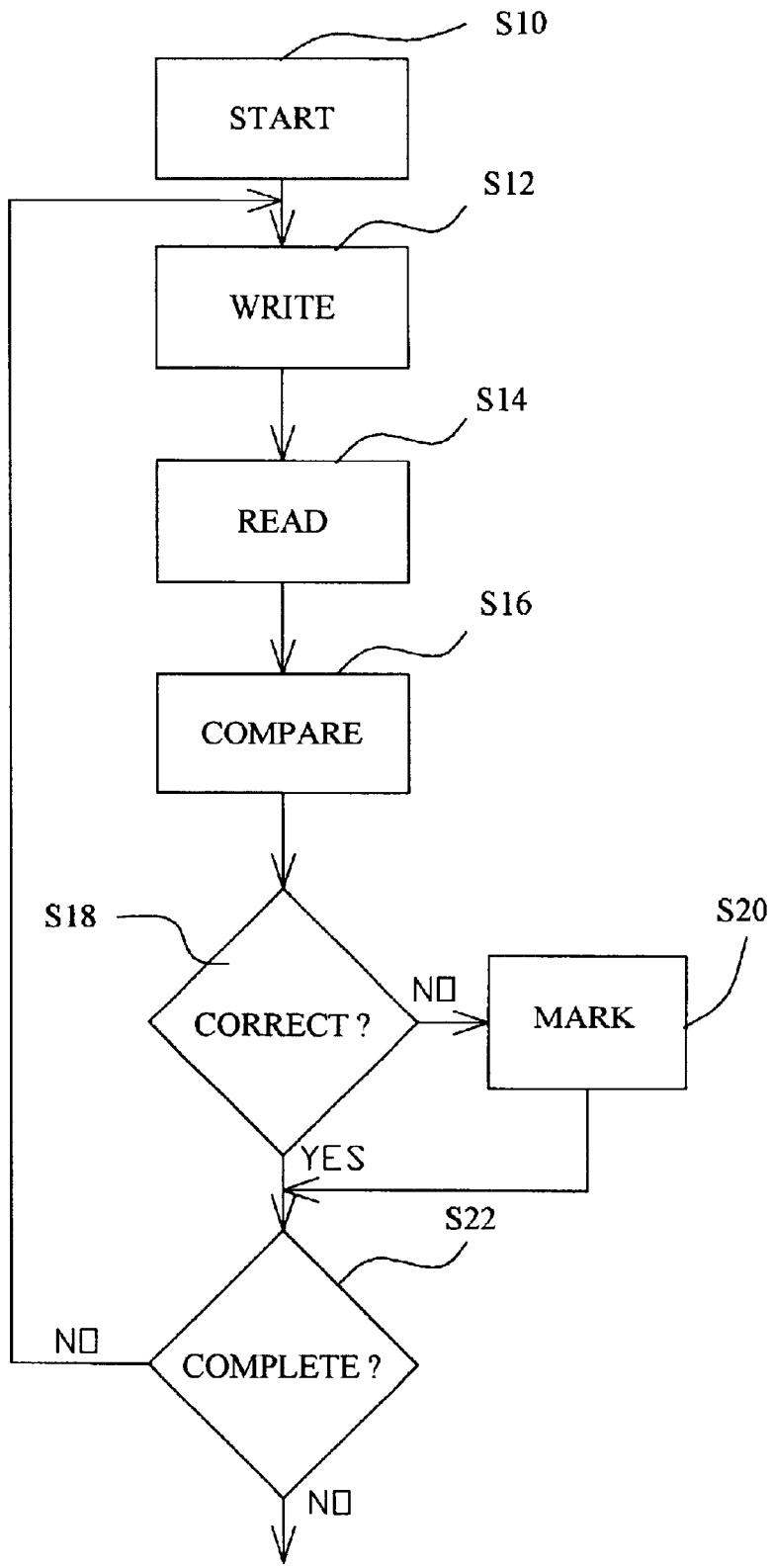
FIG. 2 is the diagram to illustrate an operation flow of the apparatus in FIG. 1.

The operation flow of the circuit shown in FIG. 1 is shown in FIG. 2. In step S10 the system is turned on or reset, and the chip with the embedded memory 100 is also activated in this phase. As is known, the system conducts a test on the embedded memory 100 in the initialization procedure, which includes tree steps. In step S12 the system writes a known data to an entry, and in step S14 reads data from that entry. Then in step 16 the system compares the read data with the written data. In step 18, if the read data and the written data match, the entry under test is functional, and in step S22, if all entries complete the test, it enters another procedure. Otherwise it goes back to step 12 to test other entries. On the other hand, if it finds an entry error in step S18 (that is, the read data is different from the written data), the entry is defective and the system enters step 20 to mark the entry as occupied in the manner as shown in FIG. 1. The initialization control apparatus 300 writes a "1" in the first field 201 of the entry occupied mapping 200 to indicate that its corresponded entry 110 is defective. The aforementioned steps are repeated until all entries are tested.

As shown in FIG. 1, the defective entry 110 of the embedded memory 100 is marked as occupied by the first field 210 of the entry occupied mapping 200, and the entry 110 will not be accessed afterwards until the system is shut down, since the entry 110 is hidden during the system initialization. Each time the system is started up, the aforementioned procedure is executed automatically, so the invented method hides defective entries dynamically. The hidden entries in the next system start up may not be the same as those hidden in this system start up. In this embodiment, though dynamical defective entry hiding reduces the effective size of the memory, a chip with defects need not be disposed of, and the defective entries cannot cause the system to malfunction or crash. Since this method directly hides the defective entries, there is no need to recalculate the effective memory size, or to modify the memory addresses.

Figure 3:
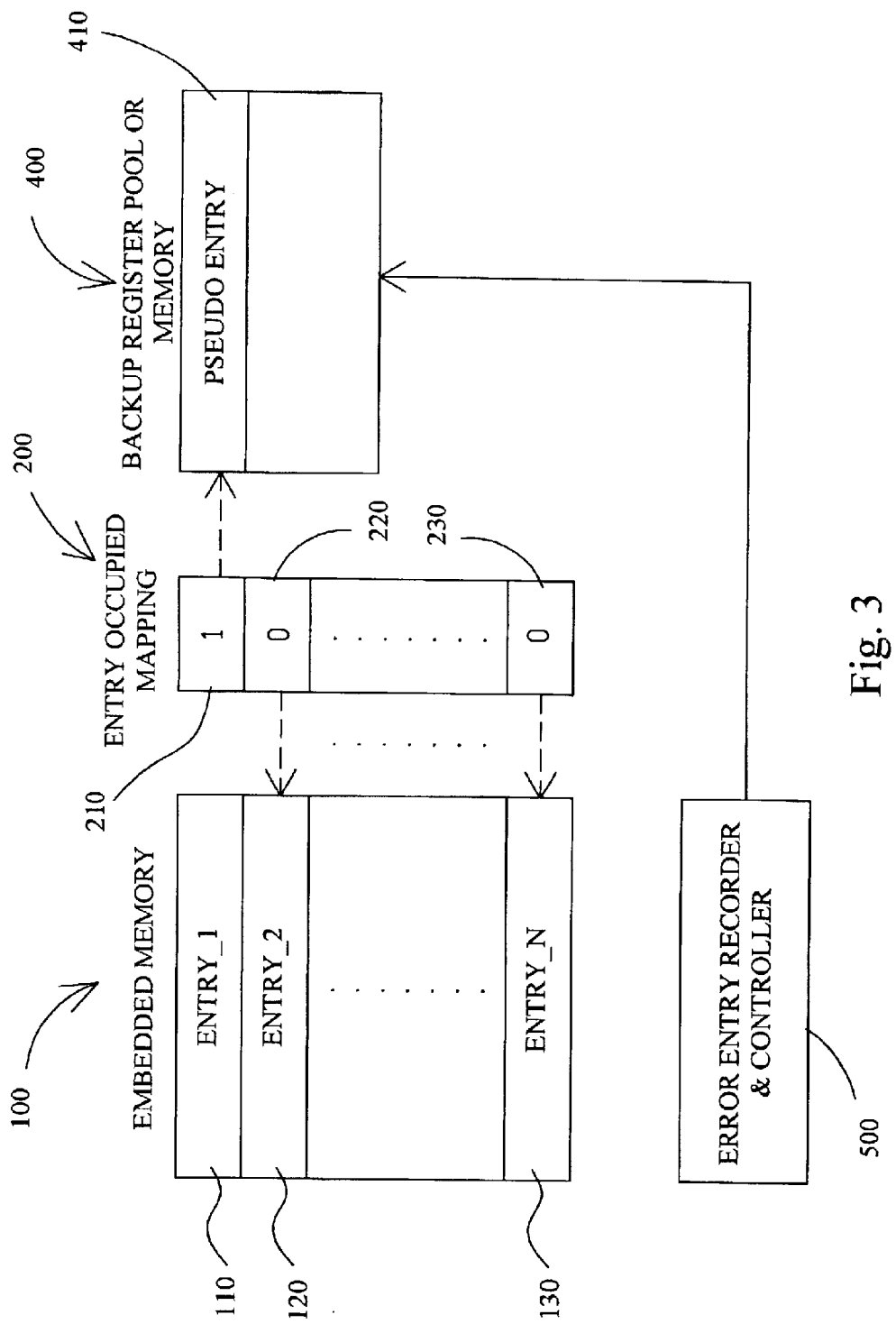
FIG. 3 shows the second embodiment apparatus according to the present invention.

The schematic diagram of the second embodiment according to the present invention is shown in FIG. 3, and as in the first embodiment, the apparatus herewith includes an embedded memory 100 and its occupied entry mapping 200. What is different from the previous embodiment is that this apparatus has a backup register pool 400 and an error entry recorder/controller 500. The backup register pool 400 is a set of pseudo entries, each of them having the same size as that of an entry of the embedded memory 100. As in the aforementioned procedure, when the system is started up the embedded memory 100 is automatically tested during the initialization procedure and the defective entries are located. Further, the error entry recorder/controller 500 records the addresses of the error entries in the embedded memory 100 and selects the same number of pseudo entries from the backup register pool 400 for substitution for the error entries so that the subsequent access to any error entry is redirected to the pseudo entry corresponding to the desired error entry. For example, as shown in this figure, the first entry 110 of the embedded memory 100 fails in the test in this example, and the error entry recorder/controller 500 selects a pseudo entry 410 from the backup register pool to substitute for the error entry 110. In each subsequent access to the entry 110, the system is redirected to the pseudo entry 410. Different from prior art schemes, this apparatus does not blow fuses to repair the memory, and thus the memory circuit is left unaltered, and a procedure of verifying for the repair is not necessary. In particular, the error entries are hidden and the accesses to the error entries are redirected to pseudo entries. Moreover, this method also dynamically hides defective entries, and upon each power on or reset the process of recording and configuration is repeated once, and the relation between pseudo entries selected from the backup register pool 400 and the error entries next time may be different from that of this time. In another embodiment, a backup memory can be employed to replace the backup register pool 400.

The same as in the first embodiment, the error recorder/controller 500 can be implemented in either hardware or software, and the backup register pool 400 and the error recorder/controller 500 can be built in or external to the chip with the embedded memory 100.

Figure 4:
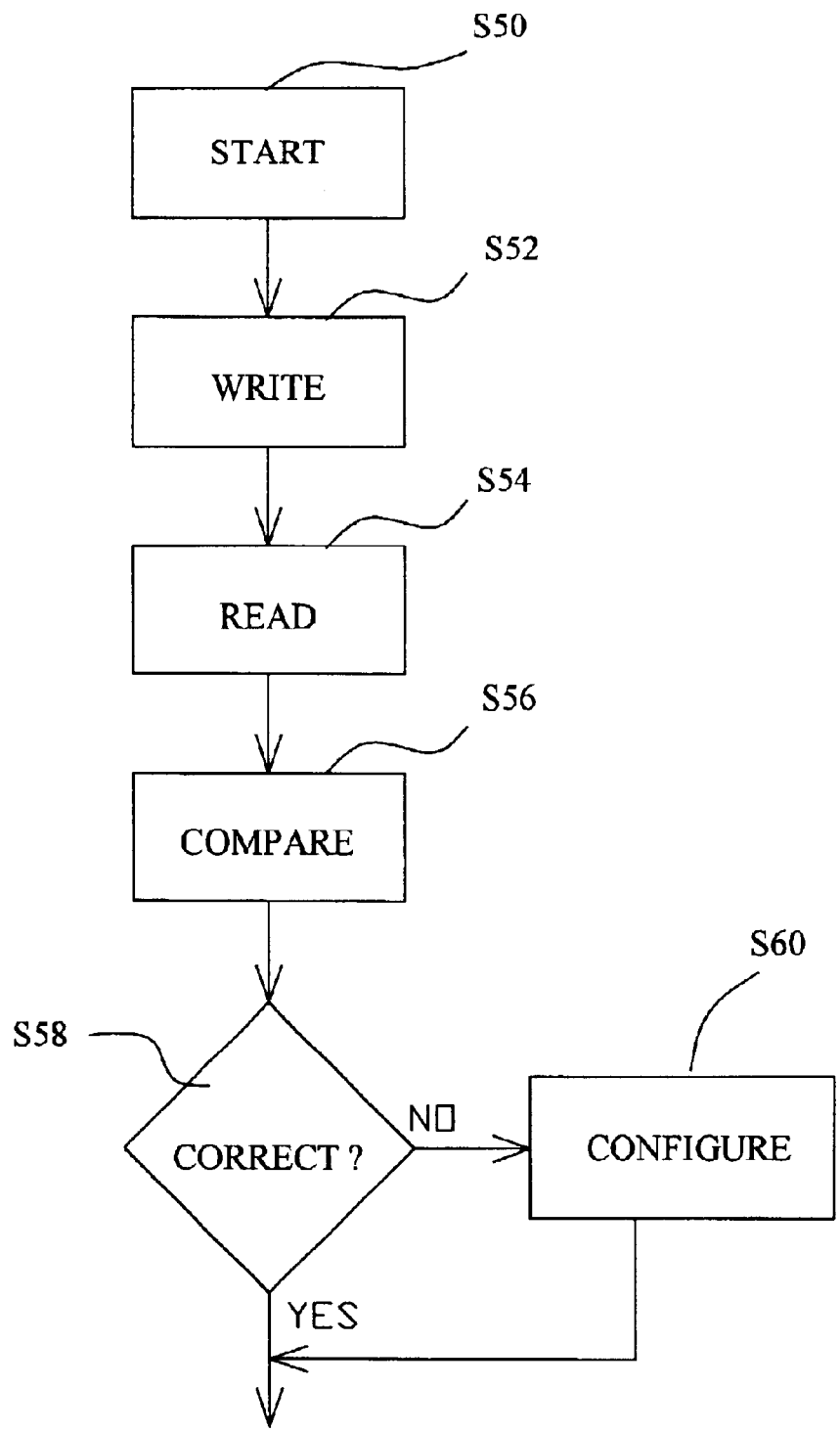
FIG. 4 is the diagram to illustrate an operation flow of the apparatus in FIG. 3.

FIG. 4 provides an operation flow of the apparatus shown in FIG. 3. In step S50 the system is powered on or reset, and the chip with the embedded memory 100 is also activated in this phase. As in the usual procedure, the system conducts a test on the embedded memory 100 in the initialization procedure. In step S52 a set of test signal patterns is written to the memory 100, and then in step S54 data is read back from the embedded memory 100. In step S56 the read data is compared with the written pattern, and in step S58, the embedded memory 100 is determined properly functional if the read and written data match. Otherwise the embedded memory 100 is defective, and the flow enters step S60 to start the configuration of the pseudo entries. Meanwhile, the error entry recorder/controller 500 records the error entries, selects pseudo entries from the backup register pool 400 and assigns them corresponding to each error entry. As shown in FIG. 3, the pseudo entry 410 is selected from the backup register pool 400 to replace the defective entry 110 in the embedded memory 100 until the system is shut down. Because this method hides the error entries and redirects memory accesses, it is not necessary to calculate the effective size of the memory 100 or to calculate the memory addresses.

Figure 5:
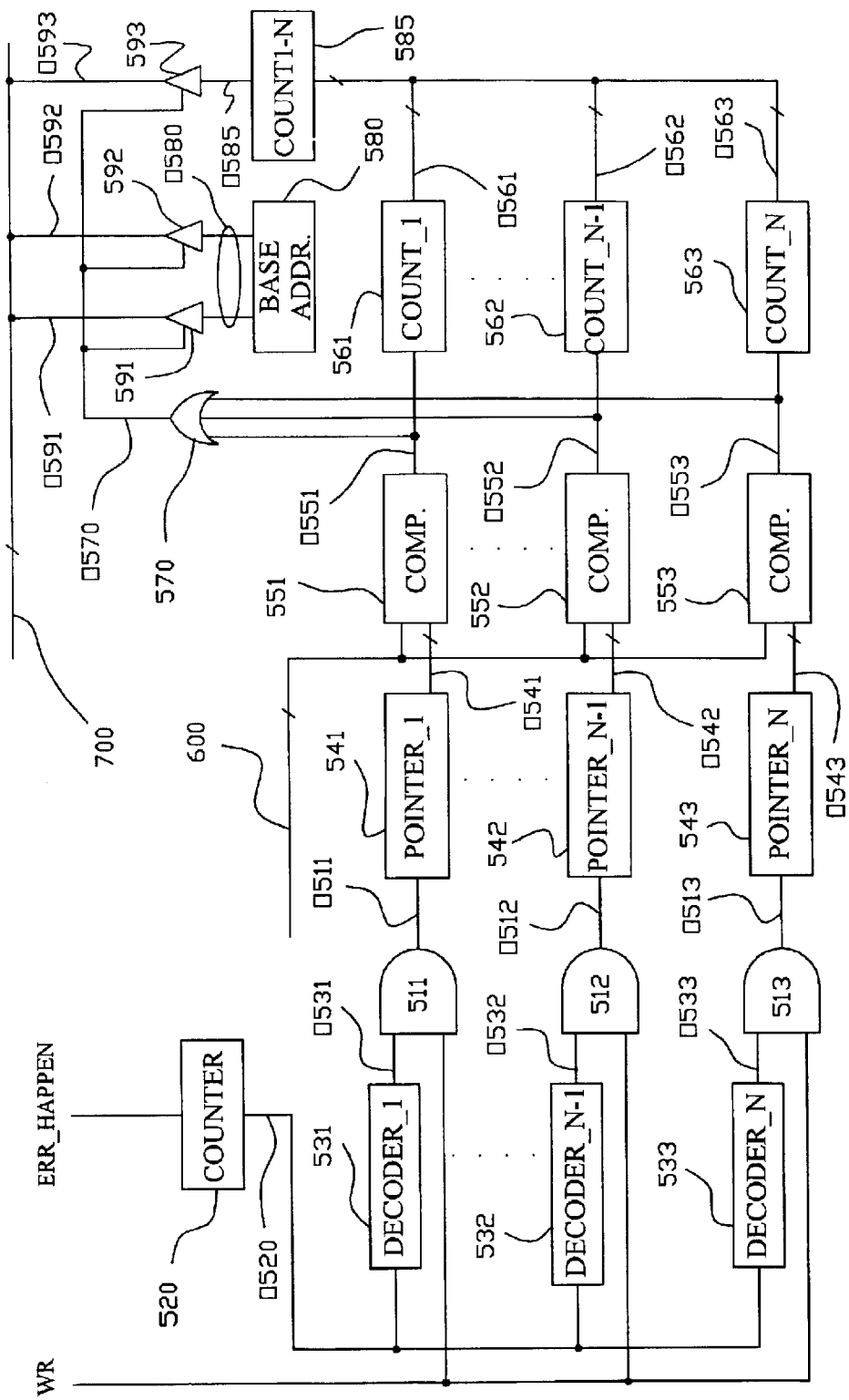
FIG. 5 is an embodiment circuit for an error entry controller.

FIG. 5 provides an embodiment circuit for the error entry controller, in which a write signal WR connects with N AND gates. For simplicity, only the first AND gate 511 and the last two AND gates 512 and 513 are shown in this figure, and other related elements are also omitted. An error happening signal ERR_HAPPEN is inputted to a counter 520, which generates output 0520 to N decoders 531, . . . , 532 and 533. Each decoder produces an output connected to its corresponding AND gate, for instance, the output 0531 of decoder_1 is sent to the AND gate 511, and each AND gate connects to respective pointer 541, . . . , 542 and 543. For instance, the first AND gate 511 is controlled by the signals WR and O531 to output signal 0511 to pointer_1, and the latter's output connects to comparator 551. Similarly, there are N comparators in total, and each comparator connects to a corresponding pointer respectively, and the other inputs of all comparators are connected to the normal entry read/write mesa 600. The output of each comparator connects to a respective counter recorder 561, . . . , 562 and 563, whose outputs count_1, . . . , count_N−1, count-N are sent to an overall counter recorder 585. The outputs from all comparators simultaneously connect to an OR gate 570 to control the multiple gates from 591, 592, . . . , 593. The count 1-N is combined with the base address 580 to generate the backup register pool or memory address 700.

The above-mentioned embodiments can be combined together, so that if there are a plurality of defective entries, some are redirected to pseudo entries by the scheme shown in FIG. 3, and the rest of the defective entries are hidden by the scheme shown in FIG. 1. For instance when the backup register pool 400 is used up, the remaining error entries are directly hidden, instead of redirected to pseudo entries.

From the above, it should be understood that the embodiments described, in regard to the drawings, are merely exemplary and that a person skilled in the art may make variations and modifications to what is shown embodiments without departing from the spirit and scope of the present invention. All variations and modifications are intended to be included within the scope of the present invention as defined in the appended claims.

What is claimed is:

1. An apparatus for dynamically hiding a defect in a memory having a plurality of entries, said apparatus comprising:
   an entry occupied mapping including a plurality of fields each corresponding to one of said entries; and
   an initialization control apparatus for marking a
   corresponding one of said fields to represent its corresponding entry as being occupied if said corresponding entry is defective.

2. An apparatus according to claim 1, wherein said fields each includes a one-bit register.

3. A method for dynamically hiding a defect in a memory having a plurality of entries and an entry occupied mapping including a plurality of fields each corresponding to one of said entries, said method comprising the steps of:
   testing said entries; and
   marking a corresponding one of said fields to represent its corresponding entry as being occupied if said corresponding entry is defective.

4. A method according to claim 3, further comprising the step of clearing said fields before said testing.

5. An apparatus for dynamically hiding a defect in a memory, said apparatus comprising:
   storage means for storing a mark to represent a defective entry in said memory as being occupied; and
   hiding means for writing said mark after said defective entry is tested.

* * * * *